(12) United States Patent
Lin et al.

(10) Patent No.: US 12,369,499 B2
(45) Date of Patent: *Jul. 22, 2025

(54) MAGNETORESISTIVE RANDOM ACCESS MEMORY AND METHOD OF MANUFACTURING THE SAME

(71) Applicant: UNITED MICROELECTRONICS CORP., Hsin-Chu (TW)

(72) Inventors: Hung-Chan Lin, Tainan (TW); Yu-Ping Wang, Hsinchu (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/582,684

(22) Filed: Feb. 21, 2024

(65) Prior Publication Data

US 2024/0196759 A1 Jun. 13, 2024

Related U.S. Application Data

(60) Division of application No. 17/692,203, filed on Mar. 11, 2022, now Pat. No. 11,944,016, which is a (Continued)

(30) Foreign Application Priority Data

Jan. 26, 2018 (CN) .......................... 201810076594.2

(51) Int. Cl.
*H10N 50/10* (2023.01)
*H10B 61/00* (2023.01)
(Continued)

(52) U.S. Cl.
CPC ............. *H10N 50/80* (2023.02); *H10B 61/00* (2023.02); *H10N 50/01* (2023.02); *H10N 50/10* (2023.02)

(58) Field of Classification Search
None
See application file for complete search history.

(56) References Cited

U.S. PATENT DOCUMENTS 2,016,008 A 10/1935 Henry
9,231,193 B2 * 1/2016 Iwayama ............... H10N 50/01
(Continued)

FOREIGN PATENT DOCUMENTS

CN 1378251 A 11/2002
CN 101345289 A 1/2009
CN 102446541 A 5/2012

*Primary Examiner* — Bilkis Jahan
(74) *Attorney, Agent, or Firm* — Winston Hsu

(57) ABSTRACT

A method of manufacturing a magnetoresistive random access memory, including forming a conductive plug in a substrate, forming a bottom electrode material layer, a magnetic tunnel junction material layer and a top electrode material layer on the substrate and the conductive plug, and performing an anisotropic etch process to pattern the bottom electrode material layer, the magnetic tunnel junction material layer and the top electrode material layer, thereby forming a magnetic memory cell on the conductive plug, wherein the anisotropic etch process overetches the conductive plug and the substrate so that a notched portion is formed on one side of an upper edge of the conductive plug, and depressed regions are formed on the substrate at two sides of the magnetic memory cell.

4 Claims, 3 Drawing Sheets

Related U.S. Application Data continuation of application No. 16/719,992, filed on Dec. 19, 2019, now Pat. No. 11,309,486, which is a division of application No. 15/904,429, filed on Feb. 26, 2018, now Pat. No. 10,593,865.

(51) Int. Cl.
*H10N 50/01* (2023.01)
*H10N 50/80* (2023.01)

(56) References Cited

U.S. PATENT DOCUMENTS

| | | | |
|---|---|---|---|
| 9,704,919 B1 | 7/2017 | Lu | |
| 9,818,935 B2 | 11/2017 | Chuang | |
| 11,309,486 B2 * | 4/2022 | Lin | H10N 50/80 |
| 2010/0019218 A1 | 1/2010 | Chung | |
| 2011/0254112 A1 * | 10/2011 | Yamanaka | H10B 61/22 |
| | | | 257/E29.323 |
| 2013/0292847 A1 * | 11/2013 | Choi | H01L 23/528 |
| | | | 257/774 |
| 2015/0061134 A1 * | 3/2015 | Lee | H10B 12/34 |
| | | | 257/751 |
| 2016/0043300 A1 | 2/2016 | Kim | |
| 2016/0079519 A1 * | 3/2016 | Yoshikawa | H10B 61/10 |
| | | | 257/421 |
| 2016/0087004 A1 * | 3/2016 | Sonoda | H10N 50/01 |
| | | | 257/421 |
| 2016/0141490 A1 | 5/2016 | Jung | |
| 2017/0069837 A1 | 3/2017 | Choi | |
| 2017/0092850 A1 | 3/2017 | Lee | |
| 2017/0352801 A1 | 12/2017 | Lee | |
| 2018/0158728 A1 | 6/2018 | Chu | |
| 2018/0205010 A1 | 7/2018 | Park | |

\* cited by examiner

MAGNETORESISTIVE RANDOM ACCESS MEMORY AND METHOD OF MANUFACTURING THE SAME

CROSS REFERENCE TO RELATED APPLICATIONS

This application is a division of U.S. application Ser. No. 17/692,203, filed on Mar. 11, 2022, which is a continuation application of U.S. application Ser. No. 16/719,992, filed on Dec. 19, 2019, which is a division of U.S. application Ser. No. 15/904,429, filed on Feb. 26, 2018. The contents of these applications are incorporated herein by reference.

BACKGROUND OF THE INVENTION

1. Field of the Invention

The present invention relates generally to a magnetoresistive random access memory (MRAM), and more specifically, to a magnetoresistive random access memory that may provide larger alignment window and method of manufacturing the same.

2. Description of the Prior Art

Magnetic (or magnetoresistive) random access memory (MRAM) is a non-volatile access memory technology that could potentially replace the dynamic random access memory (DRAM) as the standard memory for computing devices. Particularly, the use of MRAM-devices as a non-volatile RAM will eventually realize the "instant on"-systems as soon as the computer system is turned on, thus saving the amount of time needed for a conventional computer to transfer boot data from a hard disk drive to volatile DRAM during system power up.

A magnetic memory element (also referred as a tunneling magneto-resistive device, TMR device) includes ferromagnetic layers separated by a non-magnetic layer (barrier layer) and arranged into a magnetic tunnel junction (MTJ) structure. Digital information is stored and represented in the magnetic memory element as directions of magnetization vectors in the ferromagnetic layers. More specifically, the magnetic moment of one ferromagnetic layer is magnetically fixed or pinned (referred as a "reference layer"), while the magnetic moment of the other ferromagnetic layer (referred to as "free layer") is switched freely between the same and opposite directions with respect to the fixed magnetization direction of the reference layer, and the magnetic direction can be changed by applying external magnetic fields generated by a word line (WL) and bit line (BL). The above-mentioned orientations of the magnetic moment of free layer are well-known as "parallel" and "anti-parallel" states, respectively, wherein the parallel state refers to the same magnetic alignment of the free layer and reference layer, while the anti-parallel state refers to opposing magnetic alignments therebetween.

In conventional MRAM, a MRAM cell is electrically connected to underlying metal layers (such as a word line) through conductive contacts. The materials of non-magnetic layer and ferromagnetic layer are first stacked on every conductive plug in the process. The material stack is then patterned into multiple memory cells by photolithographic and etch processes, wherein each memory cell would correspond and electrically connect to an underlying conductive plug. However, with the size of semiconductor device scales, the alignment window of photolithographic process gets smaller. In this case, the memory cell is apt to shift from its predetermined position and not completely connect with the underlying conductive plug, thereby causing the increase of contact resistance and the decrease of tunneling magnetoresistance of memory cells, and the device would accordingly suffer poor performance.

SUMMARY OF THE INVENTION

In the light of insufficient alignment window for current magnetic memory process, an improved magnetic memory structure and method of manufacturing the same are provided in the present invention. In the process of present invention, the alignment window is increased through the increase of contact area of conductive plug and magnetic tunnel junction (TMR) material layer, thereby preventing the issue of poor contact between the memory cell and the conductive plug formed in later process.

One objective of the present invention is to provide a magnetoresistive random access memory, including a substrate, a conductive plug in the substrate, wherein the conductive plug has a notched portion on one side of the upper edge of the conductive plug, and a magnetic memory cell with a bottom electrode electrically connecting with the conductive plug, a magnetic tunnel junction on the bottom electrode and a top electrode on the magnetic tunnel junction, wherein the bottom surface of the magnetic memory cell and the top surface of the conductive plug completely align and overlap each other.

The other objective of present invention is to provide a method of manufacturing a magnetoresistive random access memory, including steps of providing a substrate, forming a conductive plug in the substrate, forming a bottom electrode material layer, a magnetic tunnel junction material layer and a top electrode material layer on the substrate and the conductive plug, and performing an anisotropic etch process to pattern the bottom electrode material layer, the magnetic tunnel junction material layer and the top electrode material layer, thereby forming a magnetic memory cell on the conductive plug, wherein the anisotropic etch process overetches said conductive plug and the substrate so that a notched portion is formed on one side of an upper edge of the conductive plug, and depressed regions are formed on the substrate at two sides of the magnetic memory cell.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
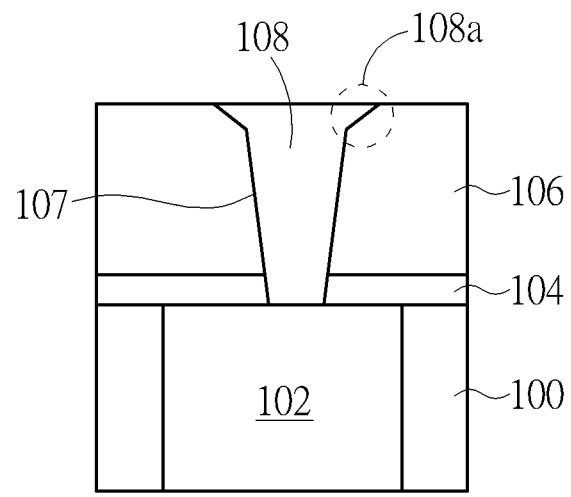
FIGS. 1-5 illustrate a process flow of manufacturing a magnetic memory cell in accordance with one preferred embodiment of the present invention.

It should be noted that all the figures are diagrammatic. Relative dimensions and proportions of parts of the drawings have been shown exaggerated or reduced in size, for the sake of clarity and convenience in the drawings. The same

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Before describing the preferred embodiment, the following description will be given for specific terms used throughout the specification. The term "etch" or "etching" is used herein to generally describe a fabrication process of patterning a material, such that at least a portion of the material remains after the etch is completed. It should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. However, in another example, etching may also refer to a process that does not use a photoresist layer, but still leaves behind at least a portion of the material after the etch process is complete. Since the photoresist layer is always removed after etch processes in general case, it will not be specifically shown in the drawing of specification unless it is necessary.

The memory cell of conventional magnetoresistive random access memory is electrically coupled to vertically adjacent interconnection (ex. metal line or metal bulk) through interconnections such as vias or metal bulk. However, the misalignment issue of conductive plug caused by process limits would impact resistance of interconnections and may further cause short circuit between adjacent interconnections.

In order to solve this problem, the present invention provides a magnetoresistive random access memory with larger alignment window and method of manufacturing the same. FIGS. 1-5 illustrate the process flow of manufacturing this kind of magnetic memory device according to one preferred embodiment of the present invention. Please refer to FIG. 1. A substrate 100 such as an interlayer dielectric (ILD) or an inter-metal dielectric (IMD) is first provided. The material of substrate 100 may be low-k material such as undoped silicate glass or silicon oxide. An underlying metal layer 102 such as a metal line made of copper or aluminum is formed in the substrate 100. In the embodiment of present invention, the underlying metal layer 102 may be source line between word lines and parallel to each other. Alternatively, the underlying metal layer 102 may be bit lines corresponding to respective bit cells and extend in parallel to each other and intersect laterally with word line. In other embodiment, the underlying metal layer 102 may be polysilicon gate or metal gate instead of metal lines, depending on the level of magnetic memory cell. A capping layer 104 (may also be referred as a dielectric protection layer) is formed on the substrate 100 and the underlying metal layer 102 with the material of silicon carbide nitride (SiCN) and silicon nitride (SiN). The capping layer 104 may function as an etch stop layer in later process.

Please refer again to FIG. 1. A dielectric layer 106 such as another inter-metal dielectric is formed on the capping layer 104 with the same material as the one of underlying substrate, such as low-k material or undoped silicate glass or silicon oxide. Contact holes 107 are preformed in the dielectric layer 106 by conventional photolithographic and etch process, in which no further explanation will be provided hereinafter. Contact hole 107 extends from the surface of dielectric layer 106 to the underlying metal layer 102 through the capping layer 104, with a sidewall slightly tapering from the top down. Please note that the contact hole 107 is formed particularly with a larger opening in the embodiment of present invention. As shown in FIG. 1, the contact hole is provided with outwardly-protruding portions 108a at top edge. The contact hole 107 is then filled up with conductive metal such as copper or tungsten and then further undergoes a chemical mechanical polishing process to form a conductive plug 108 as the one shown in the figure. The layer structure such as barrier layer (not shown) may be formed around the conductive plug 108 with the material of titanium, titanium nitride or tantalum, etc. In the embodiment of present invention, the shaped conductive plug 108 is provided with the protruding portion 108a extending outwardly from one side of the top edge, so that it will have larger exposed surface than the one of conventional plug and provides larger alignment window in later process. The profile of above-identified contact hole 107 with protruding portion 108a may be formed by any adequate method in prior art, for example, by several etch processes or by using masks to block specific portions in etch process. Since the method of forming this contact hole is not the key point of present invention. No more detail will be provided hereinafter.

Figure 2:
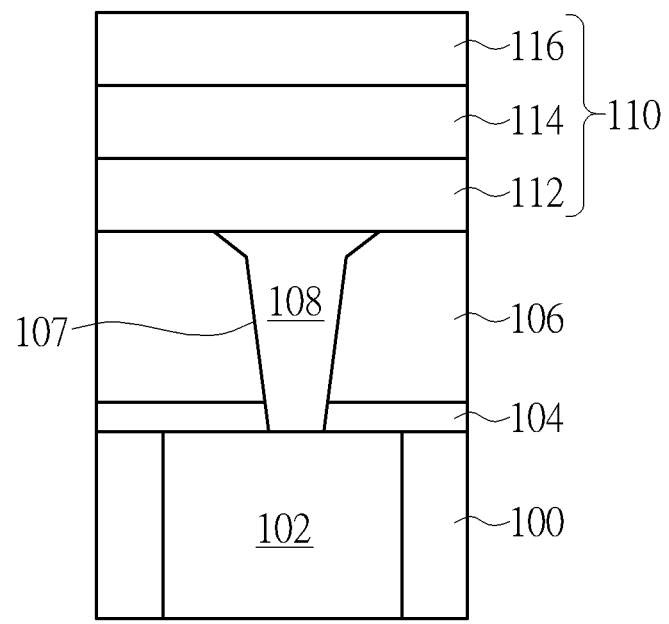

Please refer to FIG. 2. After the conductive plug 108 is formed in the dielectric layer 106, a bottom electrode material layer 112, a magnetic tunnel junction (MTJ) 114 and a top electrode material layer 116 are sequentially formed on the dielectric layer 106 and conductive plug 108 from the bottom up. The stack of these three material layers constitutes the magnetic memory cell 110 of present invention. The bottom electrode material layer 112 directly contact the conductive plug 108 below, with the material of titanium, titanium nitride, tantalum, tantalum nitride, or the combination thereof. The magnetic tunnel junction 114 is on the bottom electrode material layer 112, which may include multilayer structure like a reference layer, a barrier layer and a free layer. In the embodiment of present invention, the free layer is provided with variable magnetic polarities representing a unit of data. For example, the variable magnetic polarity switches between a first state and a second state that respectively represent a binary "0" and a binary "1". The reference layer is magnetically pinned with a fixed magnetic polarity. The barrier layer provides electrical isolation between the free layer and the reference layer, while still allowing electrons to tunnel therethrough under proper conditions. The material of reference layer may include FePt (iron-platinum) or CoFeB (alloy of cobalt, iron and boron), and the material of reference layer may include single or multiple layers of Co (cobalt), Ni (nickel), Ru (ruthenium). Since the MTJ structure of magnetic memory cell is not the key point of present invention. No more detail will be provided in the specification and drawings in case of obscuring the key points of present invention. Top electrode material layer 116 is on the magnetic tunnel junction 114, with same material as the one of the bottom electrode material layer 112, such as titanium, titanium nitride, tantalum, tantalum nitride, or the combination thereof.

Figure 3:
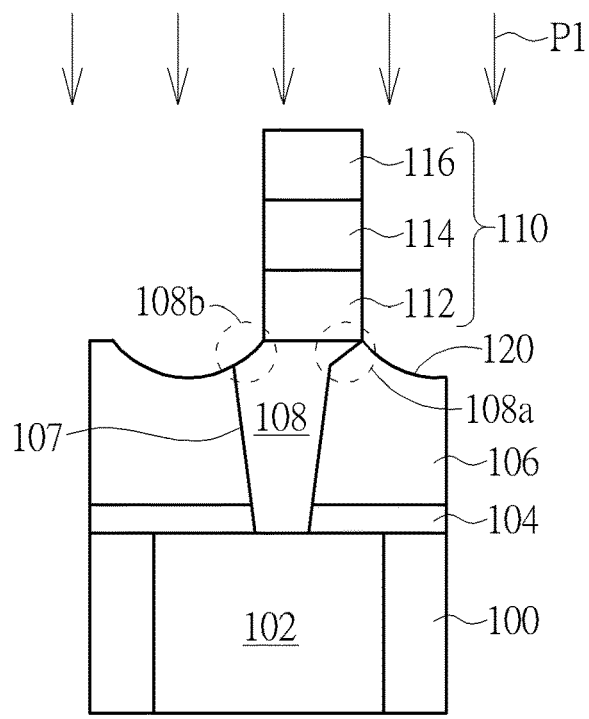

Please refer to FIG. 3. After the stack structure of bottom electrode material layer 112, magnetic tunnel junction 114 and top electrode material layer 116 is formed, a photolithographic and etch process P1 is performed to pattern the stack structure into magnetic memory cells 110. In actual process, since the alignment accuracy of photomask in this step has reached its current tool limit, it is hardly for the patterned magnetic memory cell 110 to precisely align with the conductive plug 108 thereunder. The actual patterned cell is more or less shifted to one side of the plug. This is the issue of insufficient alignment window mentioned in prior art. To address this problem, conventional solution is to increase the area of undermost bottom electrode 112 in the magnetic memory cell 110, so that it may cover entire conductive plug 108. However, this approach would significant increase the layout area required for single magnetic memory cell 110 and conflict with the purpose of increasing memory capacity per unit area in current memory architecture.

Refer still to FIG. 3. Different from the above-mentioned conventional solution, the present invention increases the available contact area by forming the conductive plug 108 with protruding portions 108a extending horizontally and outwardly at top edge, instead of increasing the area of bottom electrode 112 of the magnetic memory cell 110 like the one in prior art. As shown in FIG. 3, due to the present of protruding portion 108a, the magnetic memory cell 110 may still completely overlap the underlying conductive plug 108 in the condition of slight alignment shift, so that the contact resistance of memory cell would not be increased by reduced contact area and would not further cause the decrease of tunneling magnetoresistance.

Please refer again to FIG. 3. The advantage of this approach in the present invention is that the resulted magnetic memory cell is self-aligned. This is because the photolithographic and etch process P1 defining the memory cells 110 would overetch the underlying exposed portions, so that depressed region 120 would be formed around the magnetic memory cell 10. In the embodiment of present invention, the conductive plug 108 is also under the effect of overetch. It can be seen in the figure that the other side of conductive plug 108 is exposed and etched due to the shift of magnetic memory cell 110, thereby forming a notched portion 108b on the plug collectively constituting the depressed region 120. Through this self-aligned overetch effect, the top portion of conductive plug 108 not overlapping the magnetic memory cell 110 will be removed. This result represents that the approach of present invention would not increase the required layout area for single magnetic memory cell.

Figure 4:
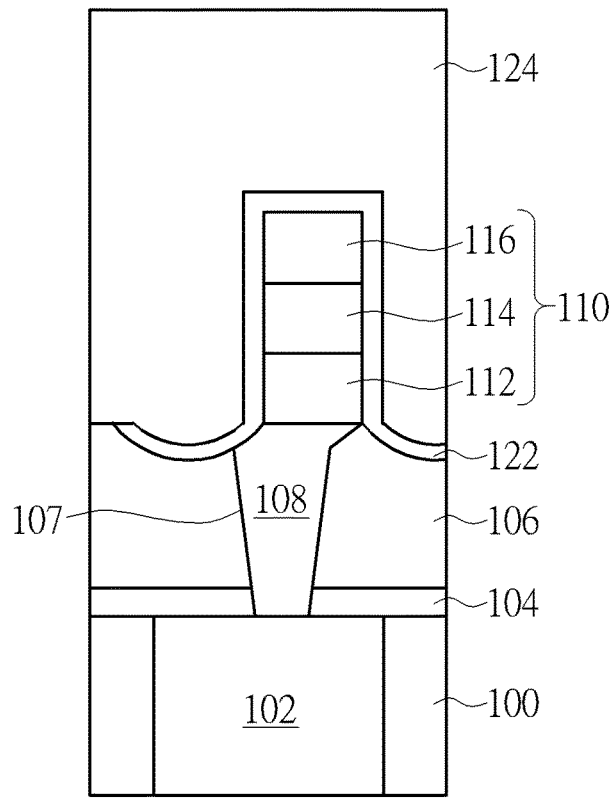

Please refer to FIG. 4. After the magnetic memory cell 110 is formed, a conformal liner layer 122 is then formed on the magnetic memory cell 110 and the dielectric layer 106 and covers entire magnetic memory cell 110. The material of liner layer 122 may be silicon carbide (SiC) or tetraethyl orthosilicate (TEOS), etc. A dielectric layer 124 is then further deposited on the liner layer 122. The dielectric layer 124 may be another inter-metal dielectric made of ultra low-k material, such as undoped silicate glass, fluorine doped silicon dioxide, carbon-doped silicon dioxide, porous silicon dioxide, or spin-coating polymer dielectric such as polynorbornenes, benzocyclobutene, hydrogen silsesquioxane (HSQ), or methylsilsesquioxane (MSQ), etc.

Figure 5:
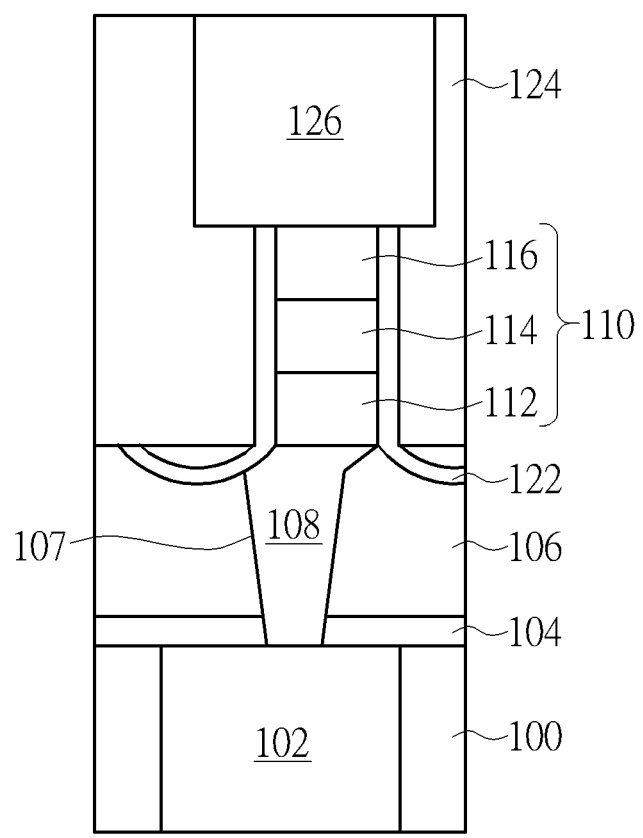

Please refer to FIG. 5. After the dielectric layer 124 is formed, an overlying metal layer 126, such as a metal line made of copper or aluminum, is then formed on the magnetic memory cell 110 in the dielectric layer 124. The liner layer 122 between the overlying metal layer 126 and the magnetic memory cell 110 will be removed, so that the overlying metal layer 126 would electrically connect with the top electrode 116 of magnetic memory cell 110. In other embodiment, the top electrode 116 may electrically connect with the overlying metal layer 126 through other conductive plugs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a magnetoresistive random access memory, comprising:
   providing a substrate;
   forming a conductive plug in said substrate;
   forming a bottom electrode material layer, a magnetic tunnel junction material layer and a top electrode material layer on said substrate and said conductive plug; and
   performing an anisotropic etch process to pattern said bottom electrode material layer, said magnetic tunnel junction material layer and said top electrode material layer, thereby forming a magnetic memory cell on said conductive plug, wherein said anisotropic etch process overetches said conductive plug and said substrate so that a notched portion is formed on one side of an upper edge of said conductive plug, and depressed regions are formed on said substrate at two sides of said magnetic memory cell.

2. The method of manufacturing a magnetoresistive random access memory of claim 1, wherein the surface of said notched portion of said conductive plug and the surface of said depressed region of said substrate are continuous curved surface.

3. The method of manufacturing a magnetoresistive random access memory of claim 1, further comprising forming an overlying metal layer on said magnetic memory cell.

4. The method of manufacturing a magnetoresistive random access memory of claim 1, further comprising forming a conformal liner layer on said magnetic memory cell and said substrate.

* * * * *